US008865515B2

(12) United States Patent
Na et al.

(10) Patent No.: US 8,865,515 B2
(45) Date of Patent: Oct. 21, 2014

(54) PREPARATION METHOD FOR REDUCED GRAPHENE OXIDE USING SULFONYL HYDRAZIDE-BASED REDUCING AGENT AND OPTOELECTRONIC DEVICES THEREOF

(75) Inventors: Seok In Na, Gwangju (KR); Dong Yu Kim, Gwanju (KR); Hye Young Koo, Seoul (KR); Jin Mun Yun, Jeollanam-Do (KR); Jun Seok Yeo, Seoul (KR); Jun Kyung Kim, Seoul (KR)

(73) Assignee: Korea Institute of Science and Technology, Seoul (KR)

( * ) Notice: Subject to any disclaimer, the term of this patent is extended or adjusted under 35 U.S.C. 154(b) by 453 days.

(21) Appl. No.: 13/356,965

(22) Filed: Jan. 24, 2012

(65) Prior Publication Data
US 2012/0190139 A1 Jul. 26, 2012

(30) Foreign Application Priority Data
Jan. 25, 2011 (KR) .................. 10-2011-0007470

(51) Int. Cl.
| | |
|---|---|
| *H01L 51/40* | (2006.01) |
| *B82Y 10/00* | (2011.01) |
| *C01B 31/04* | (2006.01) |
| *B82Y 40/00* | (2011.01) |
| *B82Y 30/00* | (2011.01) |
| *H01L 51/00* | (2006.01) |
| *H01L 51/44* | (2006.01) |
| *H01L 51/52* | (2006.01) |
| *H01L 51/50* | (2006.01) |

(52) U.S. Cl.
CPC ............. *H01L 51/0045* (2013.01); *H01L 51/44* (2013.01); *B82Y 10/00* (2013.01); *C01B 31/0476* (2013.01); *B82Y 40/00* (2013.01); *B82Y 30/00* (2013.01); *H01L 51/5206* (2013.01); *H01L 51/442* (2013.01); *H01L 51/5088* (2013.01); *Y02E 10/549* (2013.01); *H01L 51/5092* (2013.01)
USPC ........................ 438/99; 427/74; 257/E51.018

(58) Field of Classification Search
CPC ............................ H01L 51/0545; Y02E 10/50
USPC ................... 438/22, 99; 423/415.1, 448, 460; 427/58, 74, 462, 164, 228, 402
See application file for complete search history.

(56) References Cited

U.S. PATENT DOCUMENTS

2012/0190139 A1* 7/2012 Na et al. ..................... 438/22
2013/0314844 A1* 11/2013 Chen et al. .................. 361/502

FOREIGN PATENT DOCUMENTS

KR 1020100121978 A 11/2010

OTHER PUBLICATIONS

Jin-Mun Yun, et al; "Facile and rapid reduction of graphene oxide using p-toluenesul fonylhydrazide reagent via microwave irradiation", 2010, IUMRS-ICEM 2010, (Aug. 22, 2010) 161 pages.
Bin Yin, et al; "Buffer Layer of PEDOT:PSS/Graphene Composite for Polymer Solar Cells", Journal of Nanoscience and Nanotechnology, vol. 10, No. 3, Mar. 2010; pp. 1934-1938 abstract only.

* cited by examiner

*Primary Examiner* — Jack Chen
(74) *Attorney, Agent, or Firm* — Ladas & Parry LLP

(57) ABSTRACT

A method for fabricating a graphene thin film by reducing graphene oxide and a method for fabricating an optoelectronic device using the same are provided. The method for fabricating a graphene thin film includes preparing graphene oxide; preparing graphene through reducing the graphene oxide by a sulfonyl hydrazide-based reducing agent; preparing a graphene dispersed solution by dispersing the graphene into an organic solvent; and fabricating a graphene thin film by applying the graphene dispersed solution. The sulfonyl hydrazide-based reducing agent may be a compound having a sulfonyl hydrazide substituent of Chemical Formula 1 in the present disclosure in which A may be any one in Chemical Formula 2 in the present disclosure.

9 Claims, 15 Drawing Sheets

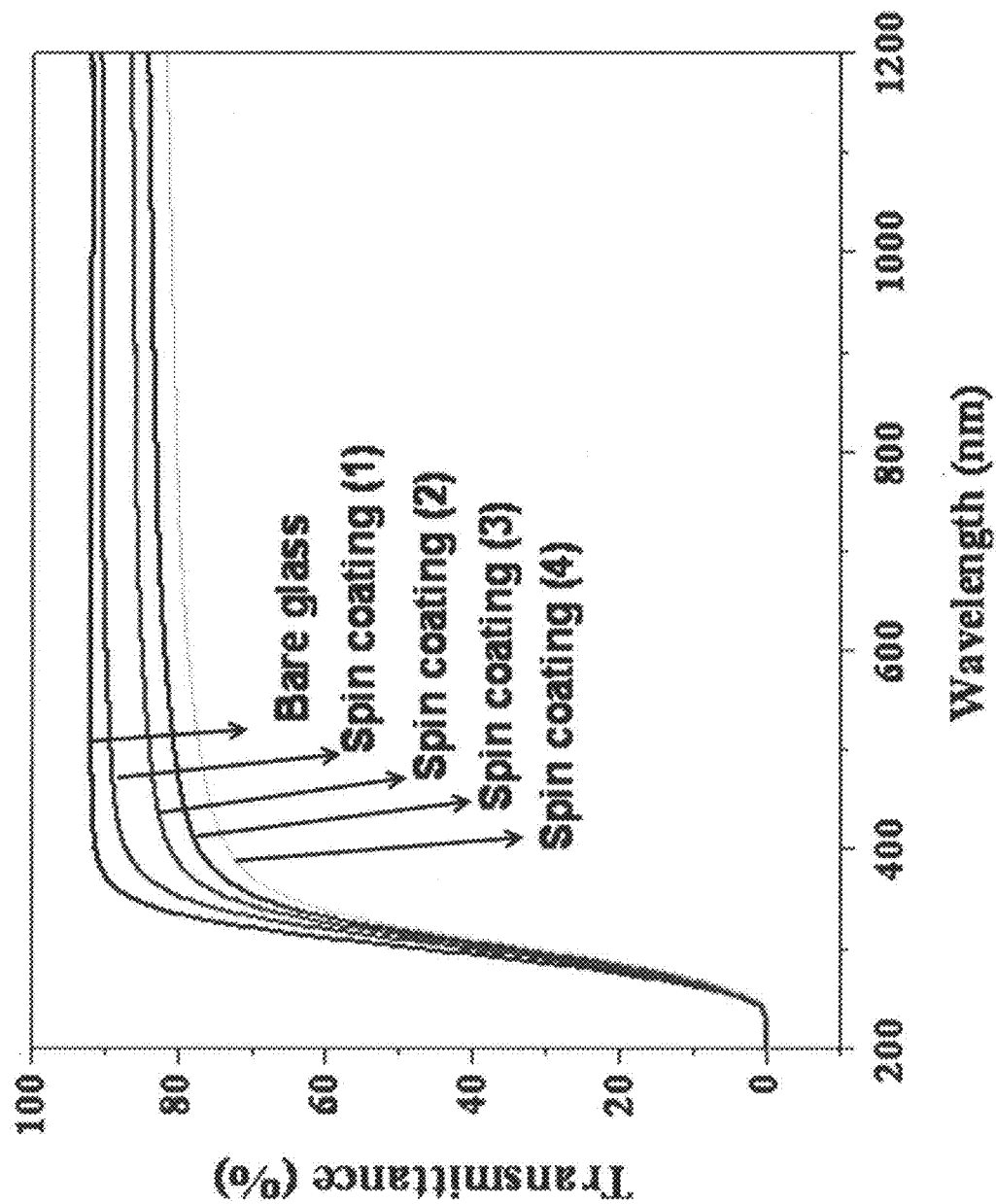

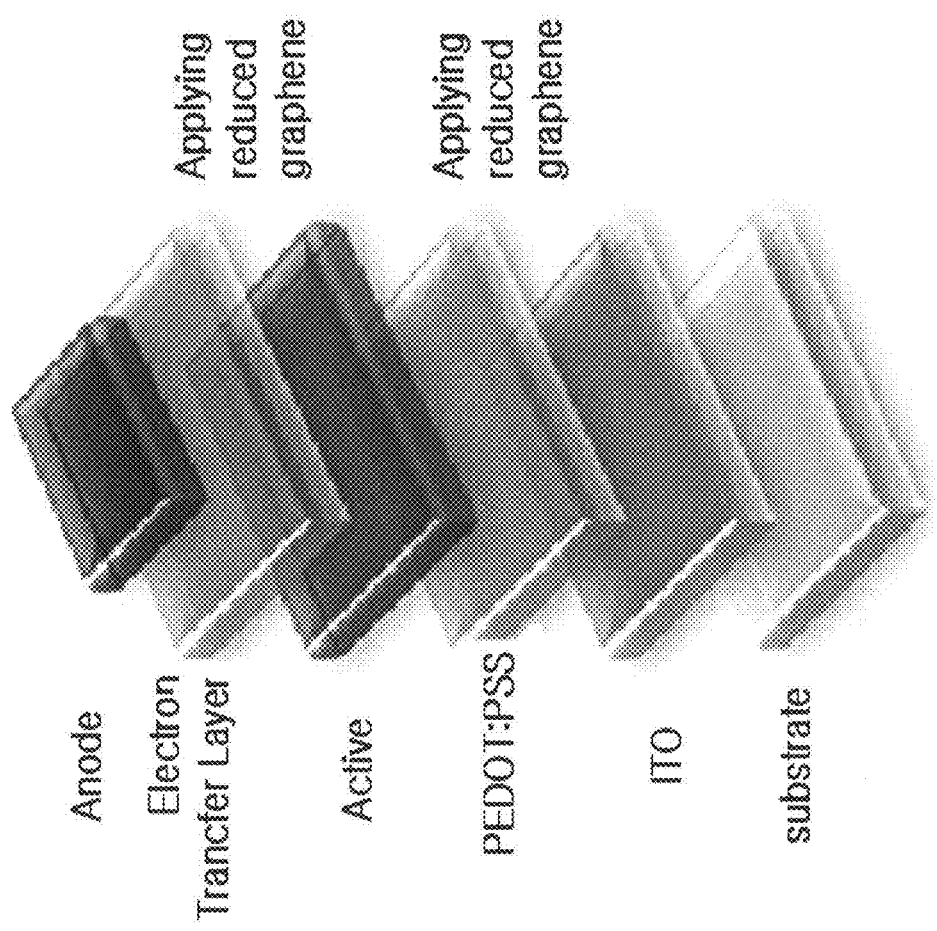

FIG. 5(c)

| | Bare ITO | GO | p-Tos GO | p-Tos GO/$N_2H_4$ | PEDOT:PSS |
|---|---|---|---|---|---|
| open voltage(V) | 0.394 | 0.555 | 0.596 | 0.414 | 0.596 |
| current density (mA/$cm^2$) | 7.2 | 4.7 | 8.1 | 7.7 | 7.8 |
| fill factor (%) | 26.1 | 22.3 | 65 | 53 | 67.1 |
| photovoltaic efficiency(%) | 0.739 | 0.585 | 3.1 | 1.7 | 3.1 |

PREPARATION METHOD FOR REDUCED GRAPHENE OXIDE USING SULFONYL HYDRAZIDE-BASED REDUCING AGENT AND OPTOELECTRONIC DEVICES THEREOF

FIELD OF THE INVENTION

The present invention relates to a graphene thin film and a preparation method for fabricating an optoelectronic device using the same, and more particularly, to a graphene thin film through reduction of a graphene oxide (GO) and a preparation method for fabricating an optoelectronic device using the same.

DESCRIPTION OF THE RELATED ART

Graphene is a material having a two-dimensional structure and excellent physical properties such as high heat conductivity, transparency, and electrical characteristics, and a lot of research into graphene is actively ongoing. As for an application of graphene, a graphene transparent electrode has been actively studied in order to replace an indium tin oxide (ITO) electrode material which is widely used currently, and graphene has come to prominence as a novel semiconductor material which may be able to replace silicon semiconductor, due to high carrier mobility characteristics thereof.

PEDOT:PSS (Poly(3,4-ethylenedioxythiophene):poly (styrenesulfonate)) is a generally widely used polymer serving as a hole transport layer and a buffer layer, and in particular, PEDOT:PSS is commonly used as a material of a buffer layer of an organic solar cell.

Although the PEDOT:PSS allows for the formation of a thin film through spin coating and has excellent transmittance, it is strongly acidic to etch ITO, impeding stability of an organic solar cell. Thus, in an effort to solve the problem, researchers have strived to develop a material that may be able to replace PEDOT:PSS, and have presented molybdenum trioxide ($MoO_3$), a method for forming a molecular monolayer on a surface of ITO through self-assembling (self-assembled monolayer), and the like. However, in the case of molybdenum trioxide, it is difficult to form a layer with uniform surface roughness, and thus there is a restriction of obtaining uniform device characteristics. Also, the method for forming a molecular monolayer on the surface of ITO can hardly be applicable to a large area and a surface effect is destroyed during a thermal treatment, and in particular, this method is unsuitable for a low-priced process.

Over the problems, since graphene has very low surface roughness owing to a two-dimensional planar surface and allows for a formation of a uniform thin film through a solution process, it can replace PEDOT:PSS, and in addition, since graphene assumes neutrality and has characteristics of preventing an element, such as oxygen, moisture, or the like, which impedes organic solar cell device characteristics from being transmitted, it contributes to enhancement of a life span of the device.

As a method for preparing graphene having such characteristics, methods such as chemical vapor deposition, sonication-assisted graphene preparation, and a method of preparing and reducing graphene oxide by oxidizing graphite according to Hummers' method are used. Among the methods, the method for preparing and reducing graphene oxide is commonly used because it is low in price and available for a solution process, and mass-produces graphene.

As for graphene oxide, a method of dispersing graphite in sulfuric acid, oxidizing the graphite by using a potassium permanganate as an oxidizing agent to separate each layer, and then, reducing the oxidized graphene by using various hydrazine derivatives (hydrazine hydrate, phenylhydrazine, methylhydrazine) is generally used. However, the hydrazine derivatives has very strong toxicity and has risks of explosion, and re-cohesion of graphene must be prevented during a reduction reaction by essentially adding a surfactant, but the surfactant acts as an insulator which impedes electrical characteristics of graphene. Thus, since a thermal treatment at a temperature of 400° C. or higher should be necessarily performed to remove the surfactant, the process is complicated and energy efficiency is degraded. Also, after preparing the reduced graphene by using the existing hydrazine derivatives, vacuum filtration or a method of forming the graphene oxide thin film and then applying hydrazine steam thereto to reduce the same is used as a thin film formation method. However, the vacuum filtration has problems in that a great deal of time is required to form a graphene film, and in particular, the graphene thin film formed through the vacuum filtration should be transferred again. These are obstacles in fabricating a graphene thin film through a solution process at a low cost, easily, and quickly. Also, the method of forming the graphene oxide thin film and then applying hydrazine steam to form reduced graphene has a difficulty in forming a uniform graphene thin film because the reduced graphene thin film is cracked or peeled off during the reduction process.

The problems must be necessarily addressed to apply graphene to organic electronics which are low in price and available for a solution process, and a formation of a graphene thin film which is uniform and available for adjusting thickness through a solution process by using reduced graphene has yet to be reported.

Therefore, a method for preparing graphene that may replace PEDOT:PSS by making use of the merits of graphene while solving the foregoing problems, in particular, a stable, environment-friendly, and economical mass-production method is required.

SUMMARY OF THE INVENTION

An object of the present invention is to fabricate graphene such that it is stable and has high density by reducing graphene oxide, in particular, to form a uniform thin film available for a solution process, and to enhance a life span of an organic solar cell device by applying the thin film to an electrode or a buffer layer of the organic solar cell.

Another object of the present invention is to replace PEDOT:PSS generally used as a buffer layer in the related art organic solar cell with fabricated uniform graphene thin film as a buffer layer to thus prevent a degradation of a life span of the device otherwise due to high acidity of PEDOT:PSS.

According to an aspect of the present invention, there is provided a method for fabricating a graphene thin film, the method comprising: (a) preparing graphene oxide; (b) preparing graphene through reducing the graphene oxide by a sulfonyl hydrazide-based reducing agent; (c) preparing a graphene dispersed solution by dispersing the graphene into an organic solvent; and (d) fabricating a graphene thin film by applying the graphene dispersed solution. The sulfonyl hydrazide-based reducing agent may be a compound having a sulfonyl hydrazide substituent represented by Chemical Formula 1 shown below, and in which, A may be any one in Chemical Formula 2(a) to (f) shown below:

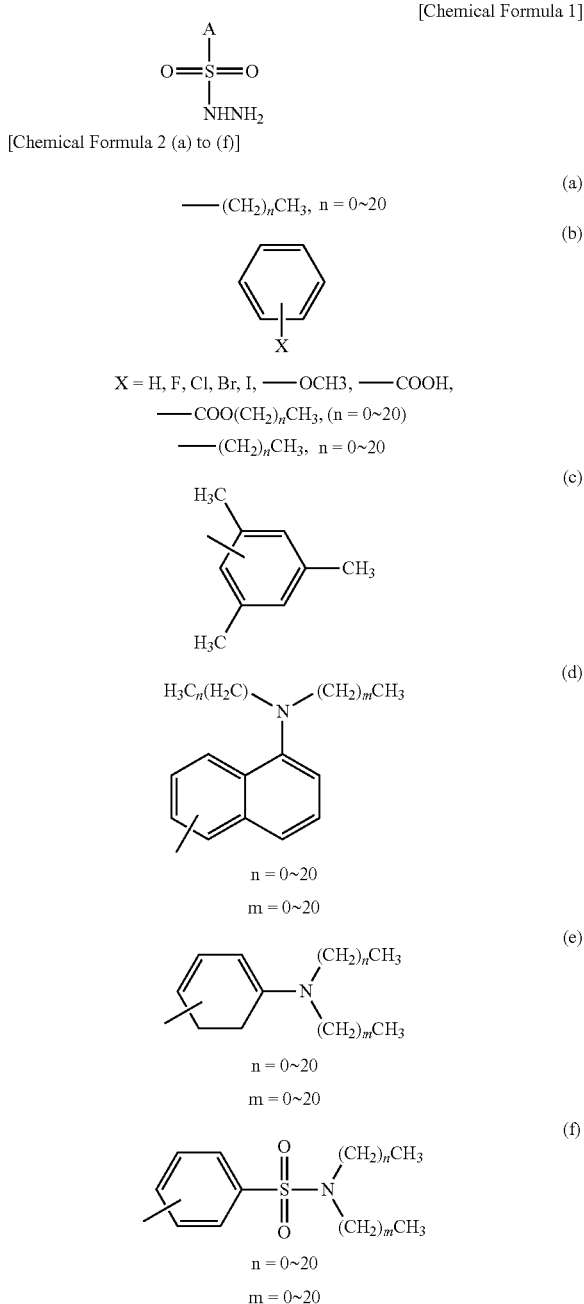

When the graphene oxide is reduced by using the hydrazine with reported method, re-cohesion occurs, the electrical characteristics of the reduced graphene according to the use of a surfactant are degraded, a thermal treatment at 500° C. or higher is required to remove the surfactant, and in particular, it is not possible to form a uniform thin film through a solution process due to a low reduced graphene concentration. However, according to embodiments of the present invention, graphene oxide can be reduced by using a novel stable/non-toxic p-toluene sulfonyl hydrazide reducing agent, and in particular, graphene oxide can be re-dispersed in an organic polarity solvent with a high concentration, and a reduced graphene thin film which is uniform and available for adjusting thickness thereof can be easily fabricated through the solution process. With these features, the thin film can be easily formed and applied as a transparent electrode and the reduced graphene thin film can be introduced to the interface between respective electrodes and a photo-activation layer through a solution process in an organic solar cell to fundamentally replace PEDOT:PSS, and since etching of ITO due to high level of acidity of PEDOT:PSS as negatively affecting a life span of the organic solar cell device can be excluded, it can be applied as a factor of enhancing the life span of the device in the long term.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 4(a) is a graph showing transmittance according to the number of times of coating graphene reduced by using p-toluene sulfonyl hydrazide.

FIG. 5(a) is a schematic view of a general device structure of an organic solar cell, FIG. 5(c) is a table of device efficiency of the organic solar cell.

DETAILED DESCRIPTION OF THE INVENTION

Figure 1A:
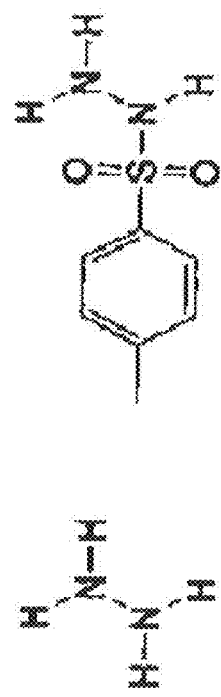
FIG. 1(a) is a schematic view showing a process of forming reduced graphene through p-toluene sulfonyl hydrazide.
Figure 1A:
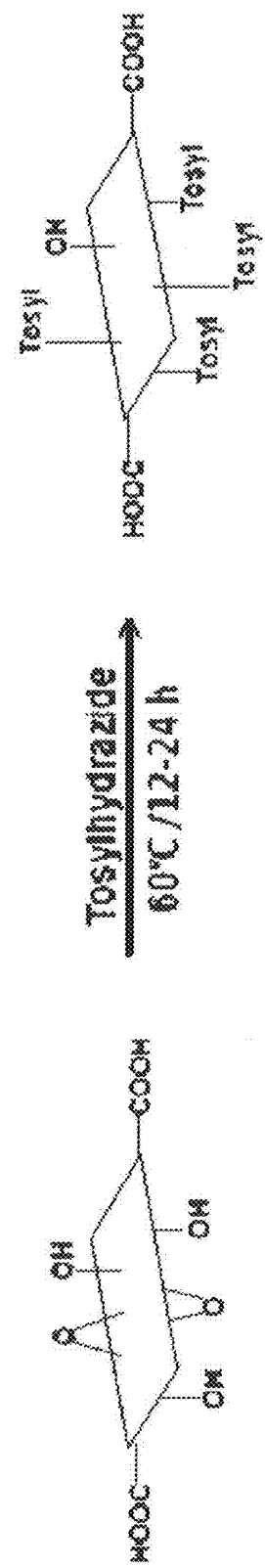

A method for fabricating a graphene thin film according to an embodiment of the present invention comprises (a) preparing graphene oxide; (b) preparing graphene through reducing the graphene oxide by a sulfonyl hydrazide-based reducing agent; (c) preparing a graphene dispersed solution by dispersing the graphene into an organic solvent; and (d) fabricating a graphene thin film by applying the graphene dispersed solution.

According to an embodiment of the present invention, in order to solve the problems of the stability and the high toxicity of a hydrazine reducing agent, sulfonyl hydrazide, which is a stable form of hydrazine, is prepared as a derivative. The sulfonyl hydrazide can be used stably to thereby induce a reaction with a hydrazide group and epoxy, aldehyde group which exist in graphene oxide, thus a reduced graphene dispersed solution having effective reducibility and high dispersibility can be prepared.

Also, graphene prepared by using the hydrazine derivatives can have excellent electrical characteristics through a reduction process of stable, environment-friendly graphene oxide.

The graphene thin film formed thusly can replace PEDOT:PSS which is generally used as a buffer layer in the related art organic solar cell.

In step (a), the graphene oxide may be obtained by treating graphite with at least one of acidic solution which is selected from a group consisting of $H_2SO_4$, $KMnO_4$, HCl, and $HNO_3$, and in the acidic solution, $H_2SO_4$ or $KMnO_4$ may be used additionally. However, the present invention is not limited thereto.

The sulfonyl hydrazide-based reducing agent may be a compound having a sulfonyl hydrazide substituent represented by Chemical Formula 1 shown below:

[Chemical Formula 1]

$$O=\overset{A}{\underset{NHNH_2}{S}}=O$$

In Chemical Formula 1, A may be any one in Chemical Formula 2 (a) to (f) shown below:

[Chemical Formula 2 (a) to (f)]

(a) —$(CH_2)_nCH_3$, n = 0~20

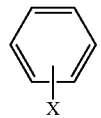
(b)

X = H, F, Cl, Br, I, —OCH3, —COOH,
—$COO(CH_2)_nCH_3$, (n = 0~20)
—$(CH_2)_nCH_3$, n = 0~20

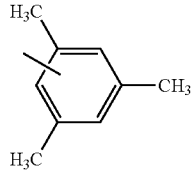
(c)

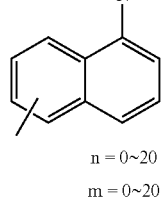
(d)

n = 0~20
m = 0~20

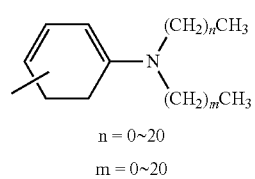
(e)

n = 0~20
m = 0~20

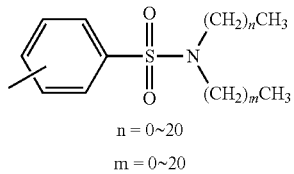
(f)

n = 0~20
m = 0~20

The organic solvent in step (c) may be any one selected from a group consisting of amides, alcohols, sulfoxides, propylene carbonate, and acetonitrile.

A thickness of the graphene thin film fabricated according to an embodiment of the present invention may range from 0.5 nm to 10000 nm.

A method for fabricating an optoelectronic device comprises (1) a step of forming a buffer layer, and (2) a step of forming an electrode layer, wherein the buffer layer and the electrode layer are formed according to the method for fabricating a graphene thin film.

When the optoelectronic device is an organic solar cell, a buffer layer may be formed on one of an interface of a positive electrode and a photo-activation layer of the organic solar cell and an interface of a negative electrode and the photo-activation layer of the organic solar cell, or on both of the interfaces thereof.

When the optoelectronic device is an organic light emitting diode (OLED), a buffer layer may be formed on any one of an interface of a positive electrode and a light emitting layer of the OLED or an interface of a negative electrode and the light emitting layer of the OLED, or on both interfaces thereof.

EXAMPLE

The present invention will be described in detail through an example. However, the example are merely examples for explaining the present invention, and the present invention is not limited thereto.

As raw materials of the present embodiment, polystyrene sulfonate (PSS) (Mw 70,000 g/mol), potassium permanganate, methylene chloride (MC), N,N-dimethylformamide (DMF), hydrogen sulfonate (98%), p-toluenesulfonylhydrazide, propylene carbonate (PPC), dimethylsulfoxide (DMSO), and methanol were purchased from Sigma-Aldrich Corporation and used, and dialysis kig (molecular cutoff membrane MW: 2000~3000 g/mol) was purchased from spectrumlab. Ultrapure water (18.3 $M\Omega cm^{-1}$) was purified from Human ultra Pure system and used.

Synthesis of Reduced Graphene Using P-Toluene Sulfonyl Hydrazide 0.1 g of graphene oxide prepared according to the Hummers method was dispersed in 100 mL of ultrapure water, 2 g of p-toluene sulfonyl hydrazide was dissolved in an 10 mL of ethanol, and then, mixed in graphene oxide dispersed solution. The mixed graphene oxide dispersed solution was reacted at 60° C. for a day, filtered out by using a poly tetrafluoroethylene (PTFE), and then, cleansed with ultrapure water, methanol, and methylene chloride. Black reduced graphene was put at a concentration of 2~3 mg/mL into DMF and dispersed for 10 minutes by 100 Watt power to prepare a reduced graphene dispersed solution.

Formation of Reduced Graphene Thin Film Through Solution Process

The reduced graphene dispersed solution obtained by dispersing reduced graphene in the DMF was applied to a glass substrate which had been subjected to a UV ozone (UV/$O_3$)

treatment (for 20 minutes), an ITO-deposited glass substrate, or a silicon substrate by variably adjusting with coating speeds from 1000 rpm to 9000 rpm and forming a thin film, and then, the thin film was thermally treated at 100° C. for 10 minutes to form a reduced graphene thin film.

Evaluation of Characteristics of Formed Graphene Thin Film (1) Sheet Resistance and Conductivity of the Reduced Graphene Thin Film Sheet resistance of the reduced graphene thin film as formed through 4 point probe system and conductivity of three portions (upper, middle, and lower portions) of the same were measured, and then, an average value was obtained. Also, a thickness of the formed thin film was measured through a thin film thickness measurement instrument (surface profiler), and conductivity of the thin film was measured.

(2) Measurement and Analysis

For Fourier transform infrared (ATR-IR) spectra of the graphene, Nicolet iS10 model of ThermoFisher Scientific Co., Ltd., U.S.A., was used. For an analysis by X-ray photoelectron spectroscopy (XPS), Axis NOVA spectroscopy of Kratos analytical Co., Ltd. was used (aluminum negative electrode, 1486.9 eV, 600 W operation). For UV spectrum, Cary 1E model of Varian was used. As an atomic force microscope (AFM), a Dimension 3100 model of veeco was used.

The present invention will be described in detail with reference to the accompanying drawings.

Figure 1B:
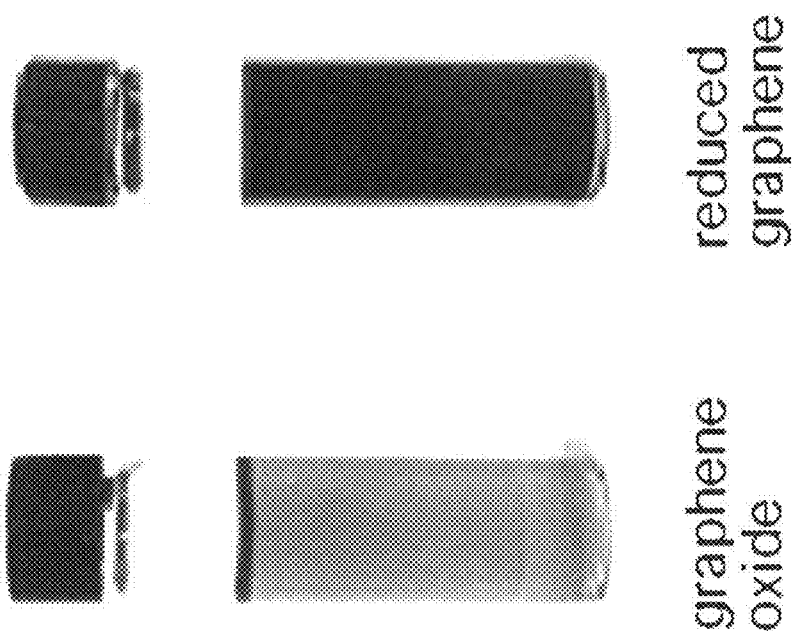
FIG. 1(b) is an image of a graphene oxide solution and a reduced graphene solution.
Figure 1C:
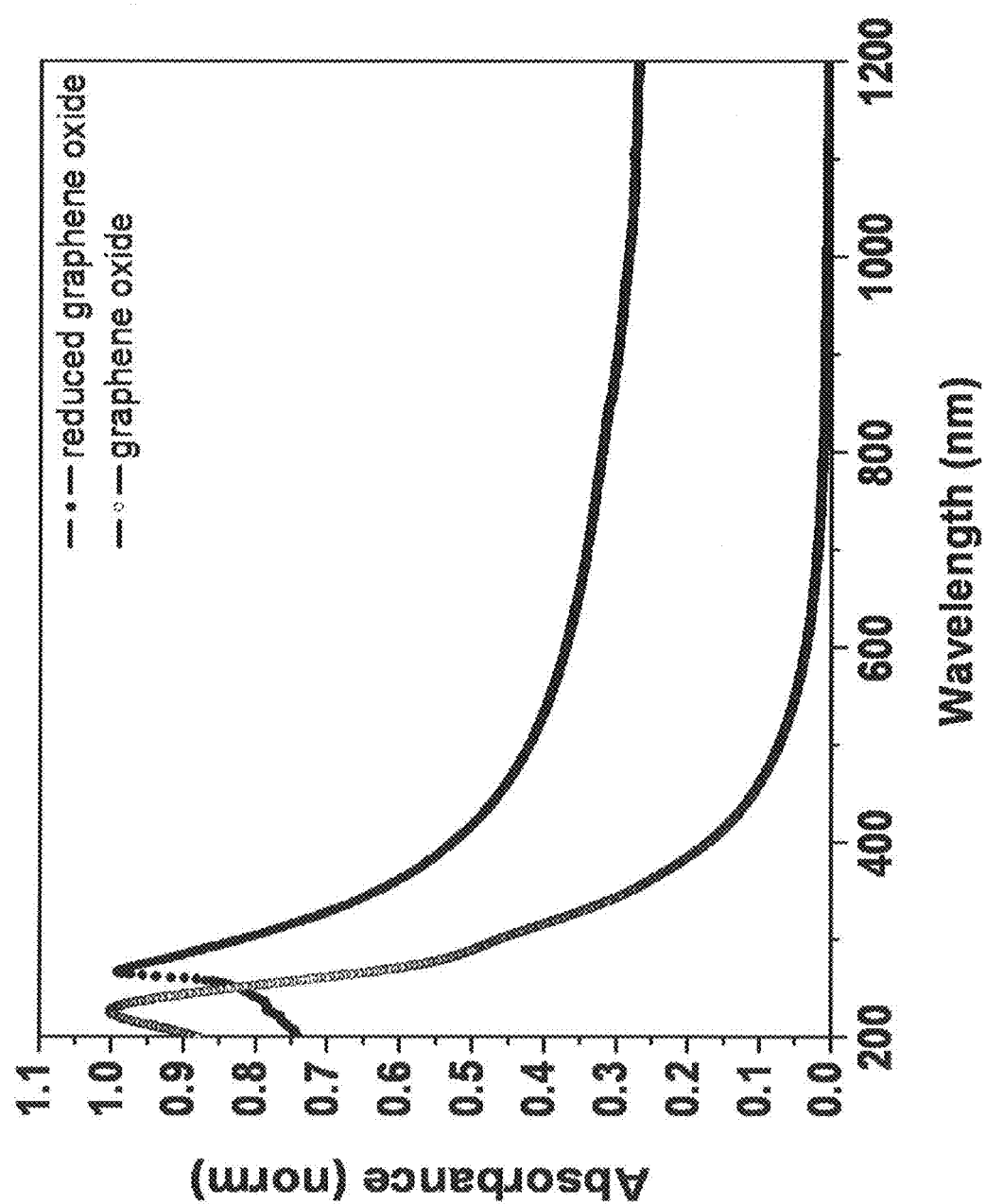
FIG. 1(c) is a UV spectrum graph of the reduced graphene.

FIG. 1(a) is a schematic view showing a process of preparing reduced graphene through p-toluene sulfonyl hydrazide, FIG. 1(b) is an image of color change of a graphene oxide solution and a reduced graphene solution, and FIG. 1(c) is a UV spectrum graph of the reduced graphene.

As noted in FIG. 1(b), as reducing went on, brown graphene oxide was changed into black reduced graphene, and it is confirmed that an absorption maximum wavelength appeared at 270 nm, which is equal to that reported in a document, through the UV spectrum analysis, and accordingly, it can be seen that broken conjugate bonds of graphene was recovered.

Figure 2A:
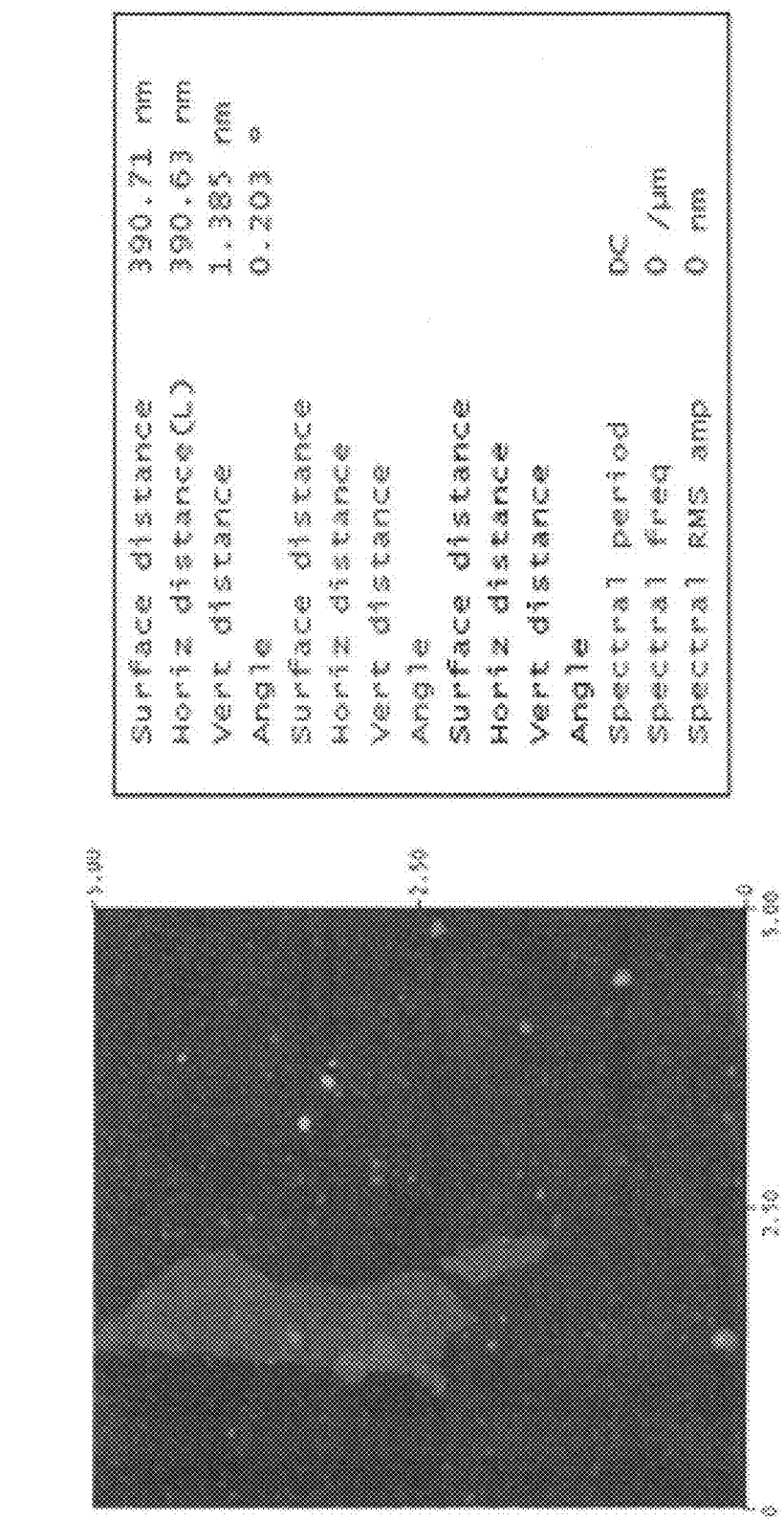
FIG. 2(a) is an AFM image of the graphene oxide and FIG. 2(b) is an AFM image of the reduced graphene through p-toluene sulfonyl hydrazide.
Figure 2B:
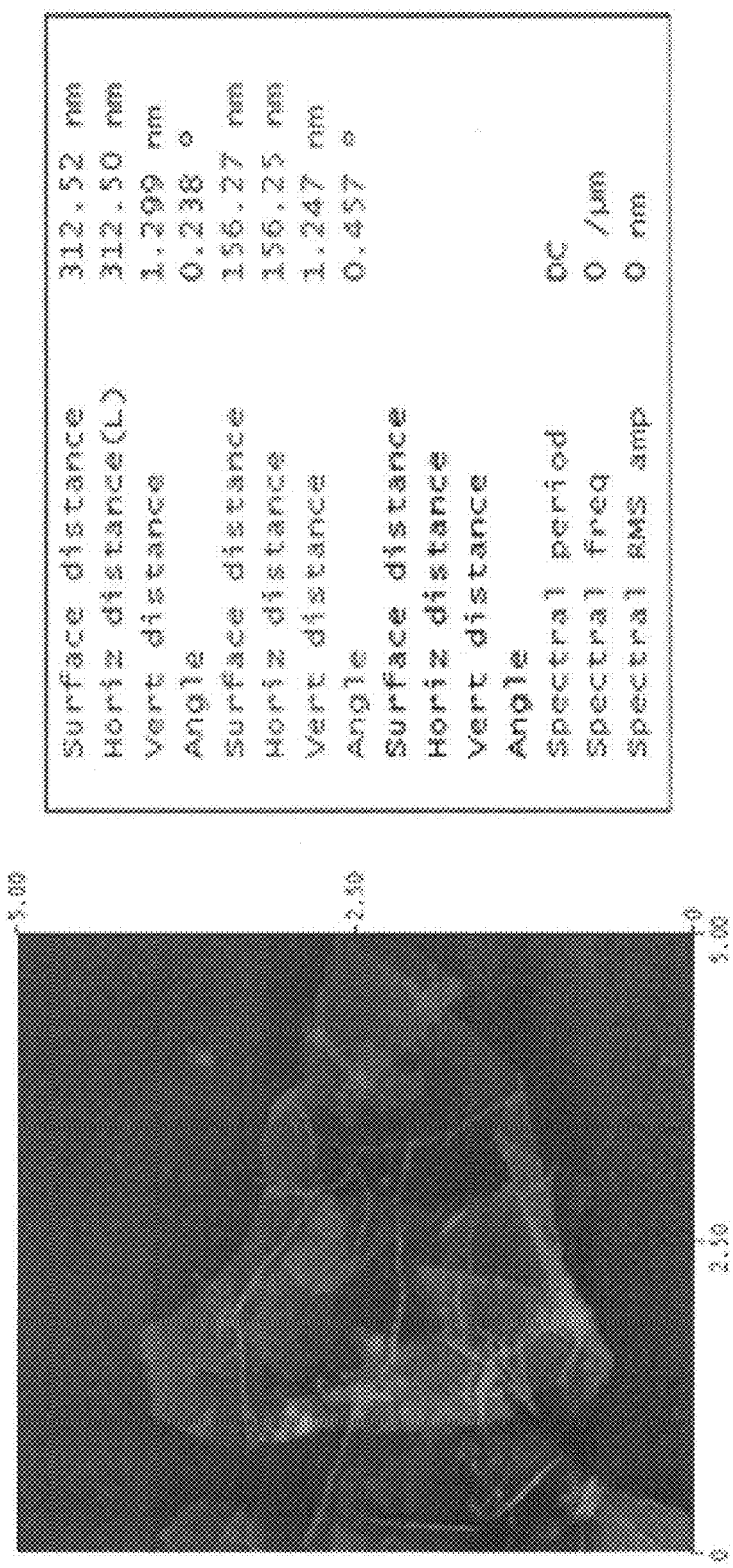

FIG. 2(a) is an AFM image of the graphene oxide and FIG. 2(b) is an AFM image of the reduced graphene through p-toluene sulfonyl hydrazide. In general, it was reported that a sheet of graphene oxide was measured to be 1~1.4 nm due to hydroxyl, aldehyde, epoxy, and carboxylic acid introduced to the surface of graphene.

As noted in FIG. 2(a), in consideration of the fact that the thickness of a sheet of graphene oxide prepared by the Hummers method was measured to be 1.4 nm, it can be noted that graphene oxide was prepared successfully.

In the AFM image of FIG. 2(b), after a reduction reaction was conducted with the sulfonyl hydrazide-based reducing agent, the thickness of the thin film was measured to be 1.3 nm. The thickness of graphene was reduced according to removal of the hydroxyl, epoxy, and aldehide functional groups covalently bonded to the surface of the reduced graphene according to the reduction reaction of the sulfonyl hydrazide-based reducing agent, while a factor of increasing the thickness of the graphene sheet due to a formation of hydrazone according to a chemical reaction between the sulfonyl hydrazide-based reducing agent and the functional groups enumerated above covalently bonded to the graphene worked together.

So it is noted that there is no difference in the thickness of the wholly reduced graphene sheet and the thickness of the graphene oxide sheet, and based on this results, there is not much difference in the thickness of the overall reduced graphene sheet through the reduction by phenyl hydrazine and re-covalent bonds of the used reducing agent to the graphene sheet.

Figure 3A:
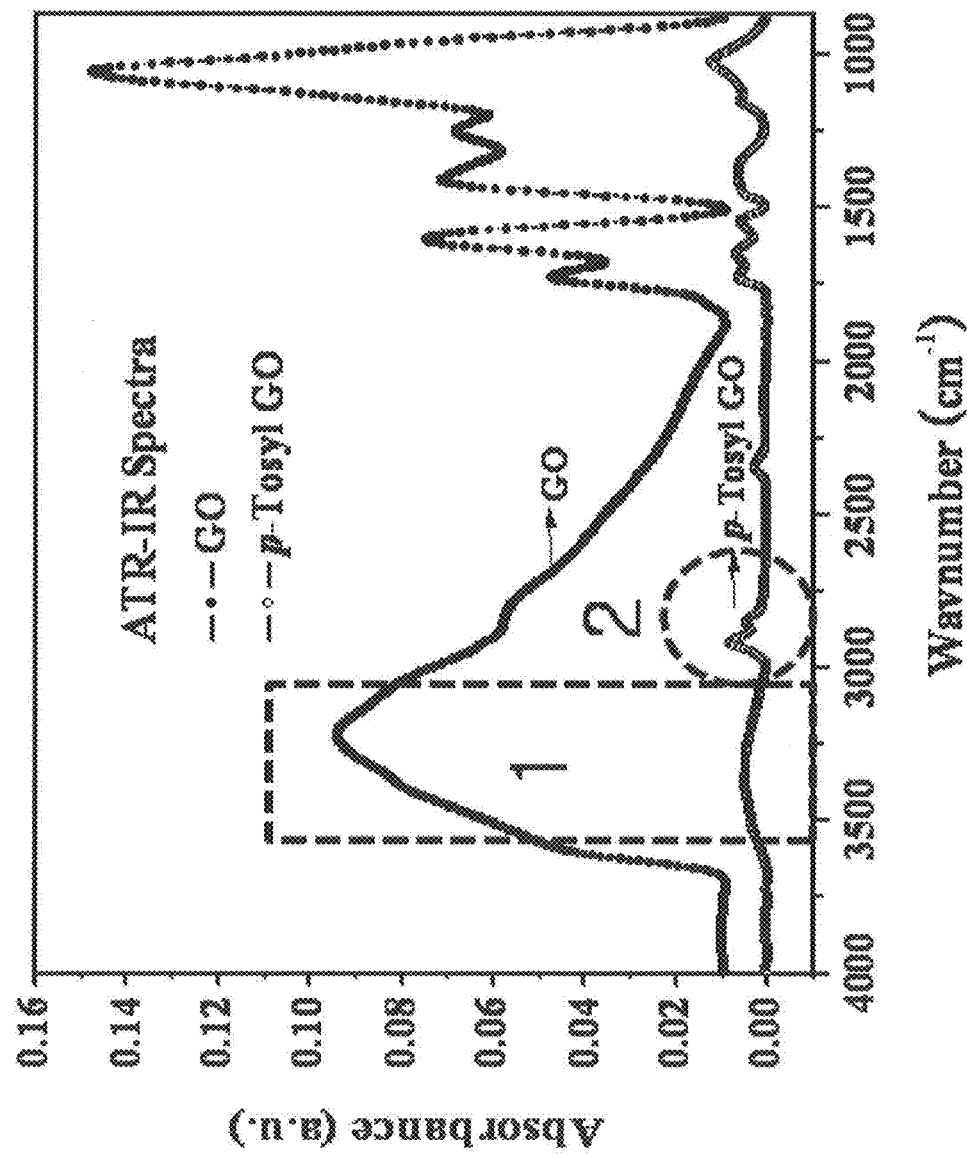
FIG. 3(a) is an ATR-IR graph of graphene oxide and reduced graphene through p-toluene sulfonyl hydrazide.

FIG. 3(a) is an infrared spectrum (ATR-IR) graph of graphene oxide and reduced graphene. In FIG. 3(a), it is noted that the strength of the hydroxyl group in the region 1 was drastically reduced in the reduced graphene, whereby it can be confirmed that reduced graphene was formed.

Figure 3B:
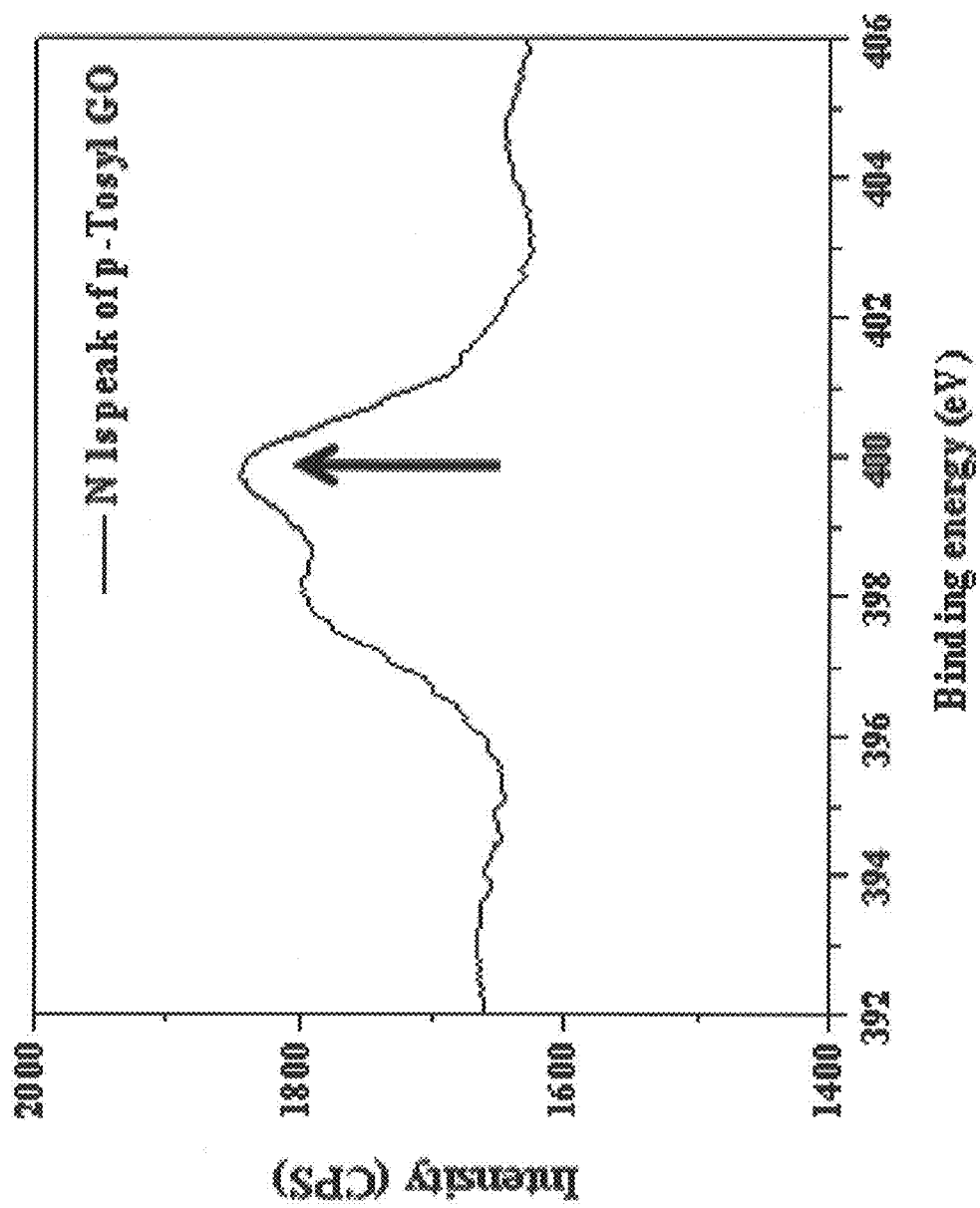
FIG. 3(b) is an XPS graph of reduced graphene formed through p-toluene sulfonyl hydrazide.

Also, in FIG. 3(a), it is noted that a spectrum was generated by a —$CH_3$ functional group of the toluene group in the region 2, and in FIG. 3(b), based on a generation of a peak of a nitrogen atom at 400 eV of the XPS data, it is noted that the p-toluene sulfonyl group was covalently bonded as an functional group.

Figure 4B:
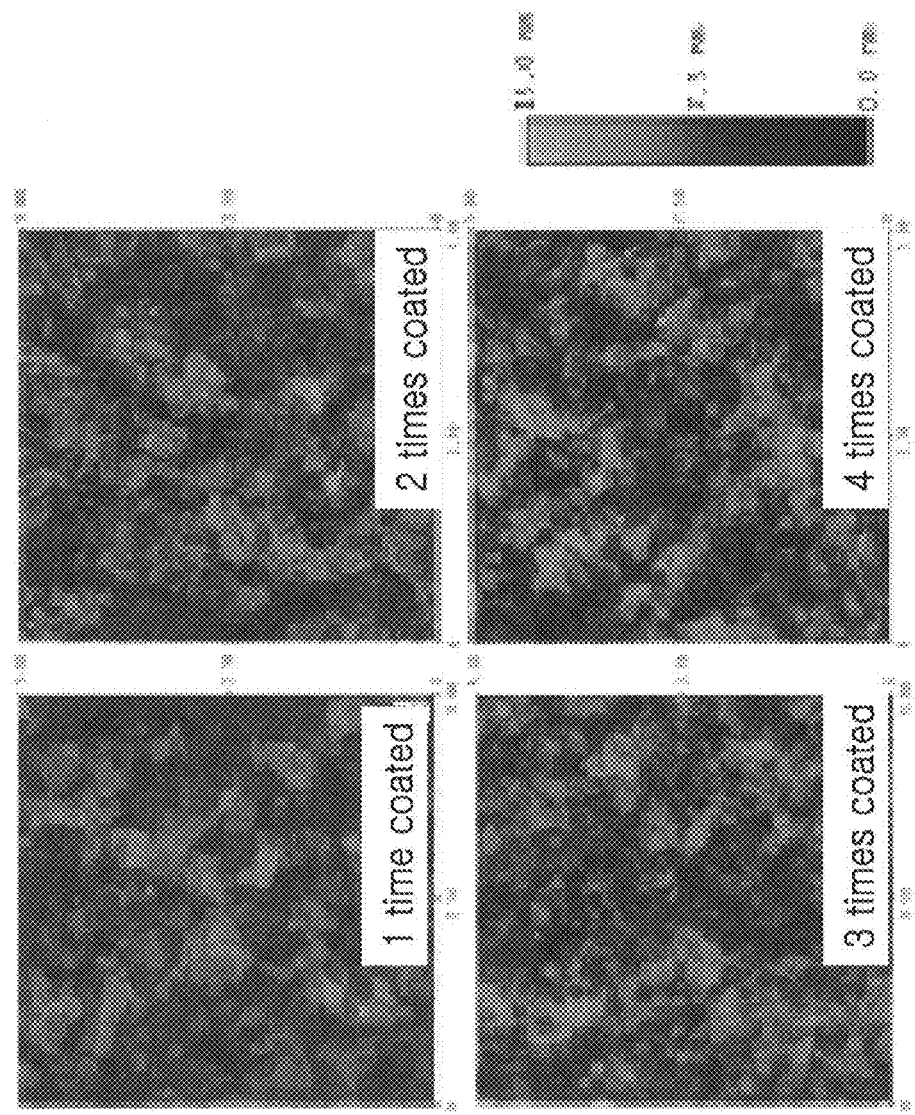
FIG. 4(b) is an AFM image of the reduced graphene thin film according to the number of times of coating.
Figure 4C:
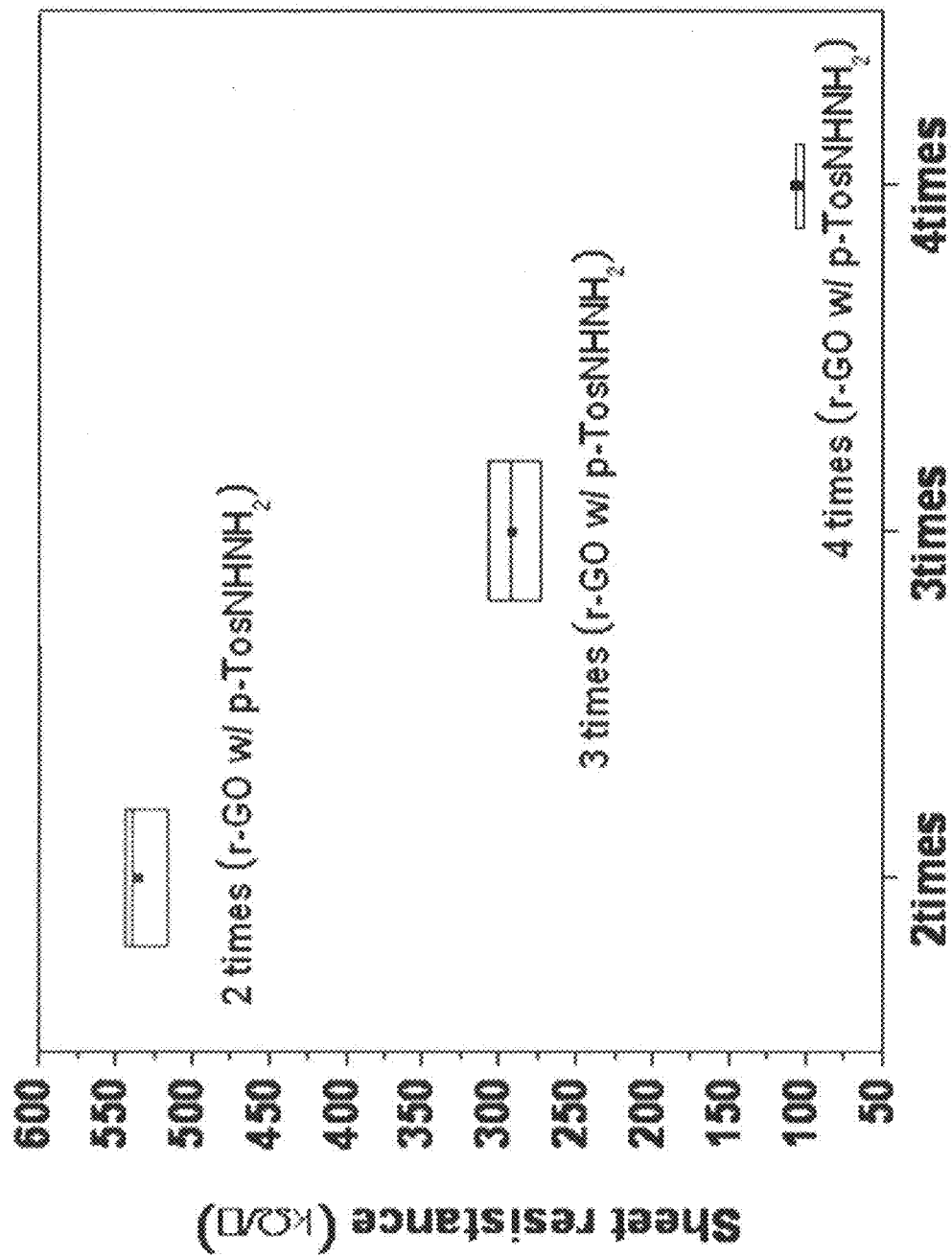
FIG. 4(c) is a graph showing sheet resistance of the thin film.
Figure 4D:
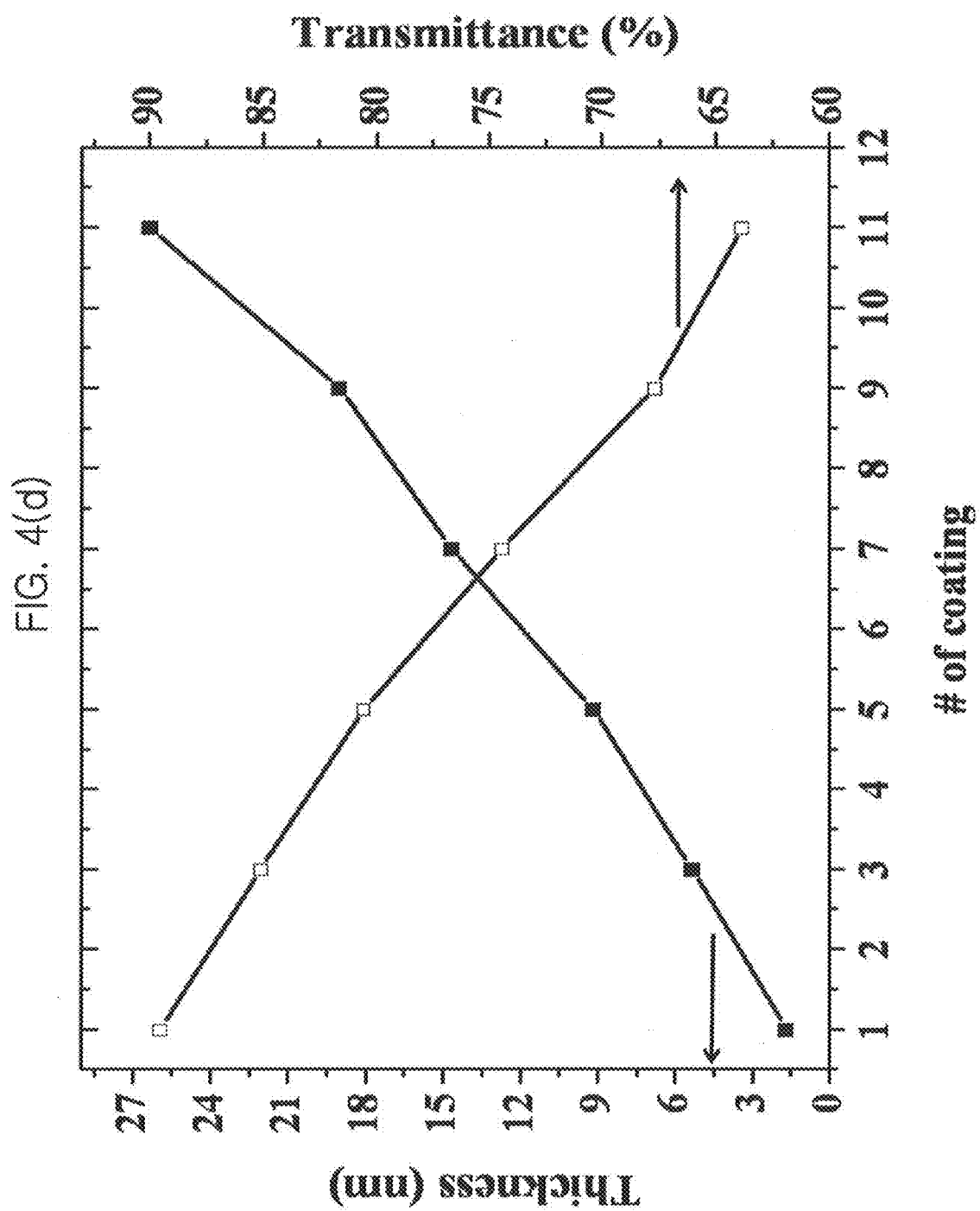
FIG. 4(d) is a graph showing correlation between a thin film thickness and transmittance.

FIG. 4(a) is a graph showing transmittance according to the number of times of spin-coating, and FIG. 4(b) is an AFM image of the reduced graphene according to the number of times of coating. Accordingly, it was ascertained that a reduced graphene thin film which is uniform and whose thickness can be adjusted can be formed. FIG. 4(c) is a graph showing the results obtained by measuring sheet resistance of the reduced thin film fabricated through the spin-coating method by a 4 point probe system, and FIG. 4(d) is a graph showing correlation between a thin film thickness and transmittance.

In particular, when a thin film having a thickness of 2 nm or greater was formed, conductivity was measured to be 17 S/cm, and this numerical value is equal to or higher than the conductivity of the reduced graphene prepared by using the hydrazine derivatives reported in the prior document. Accordingly, it can be noted that the sulfonyl hydrazide-based reducing agent of the present invention is a novel reducing agent that can replace the existing hydrazine-based reducing agent.

Also, in comparison to the existing method of fabricating reduced graphene by using hydrazine derivatives and then performing vacuum filtration or a method of forming a graphene oxide thin film and then, applying hydrazine steam thereto to reduce it, the formation of the thin film with a uniform thickness according to an embodiment of the present invention is greatly advantageous.

The method of forming a thin film through vacuum filtration has been commonly used to date, but this method requires much time to form a graphene film, and in particular, there is a problem in which the graphene thin film formed through vacuum filtration should be transferred again. These problems are considered to act as obstacles in easily and quickly fabricating a low-priced thin film through a roll-to-roll process in the future.

In addition, another problem is that when hydrazine steam is applied after the graphene oxide film is formed, the graphene film is cracked due to a reduction of the graphene oxide.

The method of preparing reduced graphene through the sulfonyl hydrazide-based reducing agent according to the present invention allow for a method for forming a graphene thin film which is uniform and whose thickness can be adjusted, and has a significant meaning in that it can solve the two problems of the hydrazine reducing agent. Above all, based on the advantages such as obtainment of thin film uniformity, formation of a thin film having high conductivity, easiness of formation of a large-scale thin film, the use of a low-priced solution process, and the like, through the novel reducing method according to the present invention, electrodes and buffer layers of various electronic devices can be formed, whereby a low-priced electronic device with high performance can be implemented.

Figure 5B:
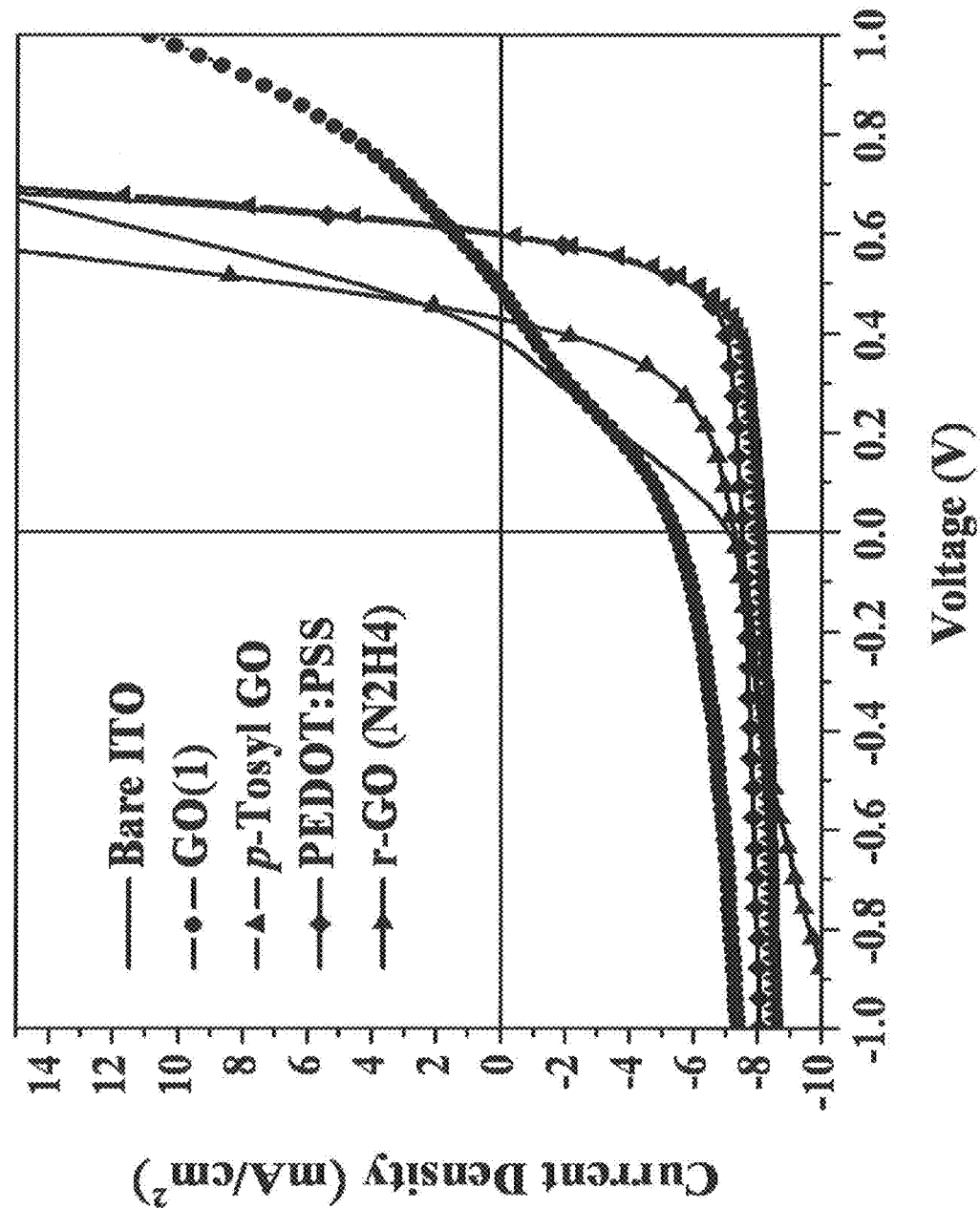
FIG. 5(b) is a current-voltage graph of the organic solar cell device.

FIG. 5(a) is a schematic view of a general device structure of an organic solar cell, and FIG. 5(b) is a current-voltage graph regarding device performance of the organic solar cell when graphene oxide, the reduced graphene prepared by using p-toluene sulfonyl hydrazide, and the reduced graphene thin film reduced by hydrazine were introduced between the ITO and the photo-activation layer as a hole transport layer and a buffer layer, instead of PEDOT:PSS, and when the hole transport layer and the buffer layer are not introduced.

When the reduced graphene prepared by using p-toluene sulfonyl hydrazide was introduced as the hole transport layer and the buffer layer to the organic solar cell, the better or equal results were obtained in comparison to the case of introduction of the PEDOT:PSS, and this is because a thin film can be uniformly introduced on the entire surface of the substrate through the reduced graphene preparation method of the present invention, and energy level is positioned to be suitable for transport holes, and the reduced graphene reduced by p-toluene sulfonyl hydrazide has higher conductivity than that of the graphene oxide.

However, in case of graphene oxide dispersed in water, it was difficult to obtain a uniform thin film, and since it has low conductivity, it degrades the device performance of the organic solar cell, and in particular, in case of the reduced graphene by hydrazine, it was difficult to obtain a uniform thin film, surface roughness was severe, and it was very difficult to obtain a uniform photo-activation film when the photo-activation layer is coated, and degrading the device characteristics.

In conclusion, it can be seen through the results that, when the reduced graphene prepared by using p-toluene sulfonyl hydrazide according to an embodiment of the present invention is used as a material of the hole transport layer and the buffer layer, the reduced graphene can fundamentally replace currently used PEDOT:PSS.

In the current-voltage graph, it can be noted that the same result of the device performance of the solar cell was obtained as that when PEDOT:PSS was used as a buffer layer, and in consideration of the fact that the organic solar cell device using current PEDOT:PSS as a buffer layer obtained the maximum photovoltaic efficiency (light to electric energy conversion), the reduced graphene according to an embodiment of the present invention can perfectly replace PEDOT:PSS used as a buffer layer of an organic solar cell and a light emitting diode.

Also, even in the general organic solar cell device structure and an inverted organic solar cell device structure, an interlayer insertion between each metal electrode and photo-activation layer is available, so the novel reduced graphene preparation method according to an embodiment of the present invention is anticipated to be applied to extensive fields.

Also, when a graphene thin film is formed by using the reduced graphene thin film prepared through the present invention on a flexible polymer substrate made of a flexible (or bendable) polymer material such as poly(ethylene-terephthalate) (PET0, polyethylene naphthalate (PEN), polyimide (Kapton), polyether ether ketone (PEEK), polyether sulfone (PES), or polyether imide (PIE) through a solution process such as spin coating, it is determined to be able to replace the PEDOT:PSS buffer layer generally used in an OLED or an organic solar cell, and it can also be applicable as an electrode of the device. FIG. 5(c) is a table of device efficiency of the organic solar cell.

Figure 6:
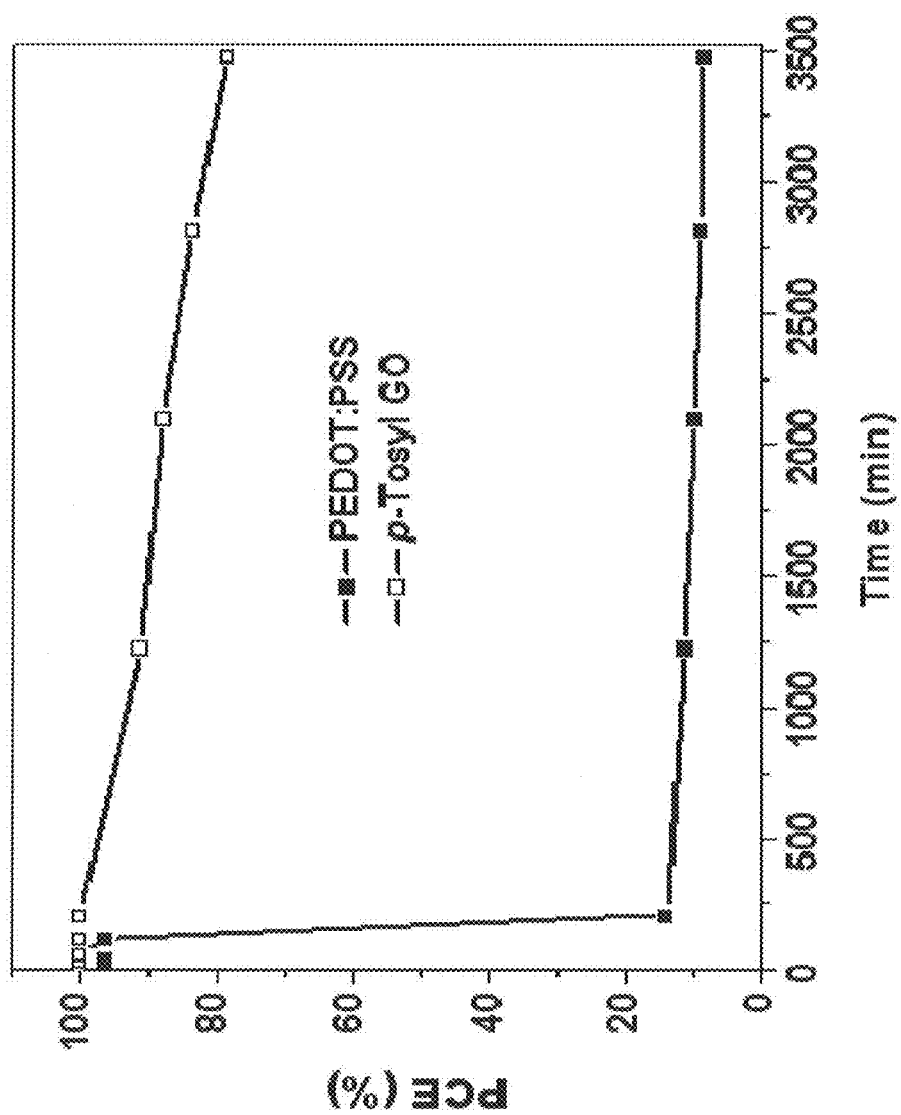
FIG. 6 is a graph showing a long-term stability of the organic solar cell device in the case of applying the conventional PEDOT:PSS and in the case of applying the reduced graphene using p-toluene sulfonyl hydrazide as a buffer layer of the organic solar cell.

FIG. 6 is a graph showing stability of an organic solar cell device over time when PEDOT:PSS was introduced, and when PEDOT:PSS was not introduced, and when p-toluene sulfonyl hydrazide was introduced by thickness. It can be seen that, when p-toluene sulfonyl hydrazide was introduced, surface roughness was reduced, neutrality characteristics were obtained, and air or moisture was prevented from passing through, so a life span of the device was drastically increased, in comparison to PEDOT:PSS. This is a solution that can stably drive the device and significantly enhance a life span thereof at a timing when a long-term stability of the organic solar cell device is problematic.

As the present invention may be embodied in several forms without departing from the characteristics thereof, it should also be understood that the above-described embodiments are not limited by any of the details of the foregoing description, unless otherwise specified, but rather should be construed broadly within its scope as defined in the appended claims, and therefore all changes and modifications that fall within the metes and bounds of the claims, or equivalents of such metes and bounds are therefore intended to be embraced by the appended claims.

What is claimed is:

1. A method for fabricating a graphene thin film, the method comprising:
   (a) preparing graphene oxide;
   (b) preparing graphene through reducing the graphene oxide by a sulfonyl hydrazide-based reducing agent;
   (c) preparing a graphene dispersed solution by dispersing the graphene into an organic solvent; and
   (d) fabricating a graphene thin film by applying the graphene dispersed solution.

2. The method of claim 1, wherein, in step (a), the graphene oxide is obtained by treating graphite with at least one of acidic solution which is selected from a group consisting of $H_2SO_4$, $KMnO_4$, HCl, and $HNO_3$.

3. The method of claim 2, wherein $H_2SO_4$ or $KMnO_4$ is additionally applied in the acidic solution.

4. The method of claim 1, wherein the sulfonyl hydrazide-based reducing agent is a compound having a sulfonyl hydrazide substituent of Chemical Formula 1 shown below:

[Chemical Formula 1]

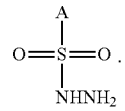

5. The method of claim 4, wherein A is any one in Chemical Formula 2(a) to (f) shown below:

[Chemical Formula 2 (a) to (f)]

(a) $—(CH_2)_nCH_3—$
$n = 0\sim20$ (b)
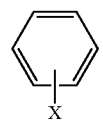

$X = H, F, Cl, Br, i, —OCH3, —COOH,$
$—COO(CH_2)_nCH_3, (n = 0\sim20)$
$—(CH_2)_nCH_3, n = 0\sim20$ -continued (c) 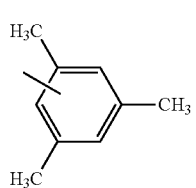

(d) 

n = 0~20
m = 0~20

(e) 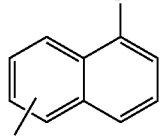

n = 0~20
m = 0~20

(f) 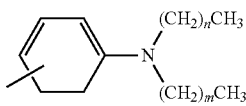

n = 0~20
m = 0~20

6. The method of claim 1, wherein the organic solvent is at least any one selected from a group consisting of amides, alcohols, sulfoxides, propylene carbonate, and acetonitrile.

7. The method of claim 1, wherein a thickness of the graphene thin film ranges from 0.5 nm to 10000 nm.

8. A method for fabricating an optoelectronic device comprising (1) a step of forming a buffer layer, and (2) a step of forming an electrode layer, wherein the buffer layer and the electrode layer are formed according to the method comprising: (a) preparing graphene oxide; (b) preparing graphene through reducing the graphene oxide by a sulfonyl hydrazide-based reducing agent; (c) preparing a graphene dispersed solution by dispersing the graphene into an organic solvent; and (d) fabricating a graphene thin film by applying the graphene dispersed solution.

9. The method of claim 8, wherein the optoelectronic device is an organic solar cell or an organic light emitting diode (OLED), in the organic solar cell, a buffer layer is formed on one of an interface of a positive electrode and a photo-activation layer or an interface of a negative electrode and the photo-activation layer, or on both of the interfaces thereof, and in the OLED, a buffer layer is formed on one of an interface of a positive electrode and a light emitting layer or an interface of a negative electrode and the light emitting layer, or on both of the interfaces thereof.

* * * * *